United States Patent

[11] 3,624,413

[72] Inventor David K. Ford
1339 Chestnut St., Terre Haute, Ind. 47807

[21] Appl. No. 862,841
[22] Filed Oct. 1, 1969
[45] Patented Nov. 30, 1971

[54] ELECTRONIC CIRCUIT
8 Claims, 3 Drawing Figs.

[52] U.S. Cl. 307/254, 328/241
[51] Int. Cl. H03k 17/00
[50] Field of Search 307/241, 254, 262, 255, 236; 328/118

[56] References Cited

UNITED STATES PATENTS 3,148,286 9/1964 Pickering et al. 307/241
3,191,121 6/1965 Nelson 307/254 X

*Primary Examiner*—Donald D. Forrer
*Assistant Examiner*—B. P. Davis
*Attorneys*—John W. Behringer, Eugene L. Bernard, Martin J. Brown, James N. Dresser, W. Brown Morton, Jr., John T. Roberts, Malcolm L. Sutherland and Morton, Bernard, Brown, Roberts and Sutherland

ABSTRACT: A phase or polarity selective electronic control or amplification circuit requiring no reactive components and capable of transforming a single-ended input signal into out-of-phase output signals. The circuit includes switching or gating means to which the input signal is applied and which control one or more output circuit means. When an input signal of a first phase is applied to the switching or gating means, one or more output circuit means are permitted to pass current. When an input signal of another phase is applied, other output circuit means are permitted to pass current. The output circuit means can be connected to separate loads so that the particular load energized is determined by the phase of the input signal. Alternatively, the output circuit means can be connected to a single load so that the direction of current flow through that load is determined by the phase of the input signal, as in a push-pull amplifier.

INVENTOR
DAVID K. FORD

BY
McLean, Morton & Boustead
ATTORNEYS

INVENTOR
DAVID K. FORD
BY
McLean, Morton + Boustead
ATTORNEYS

ELECTRONIC CIRCUIT

The present invention relates to a phase or polarity selective electronic control or amplification circuit and to a basis of operation of such circuitry. More particularly, the present invention relates to a method and circuit for transforming a single-ended input signal into two out-of-phase signals capable of controlling one or more output units. The invention might be utilized in any one of several applications, such as controlling separate output devices in response to input signals of different polarity or such as an amplifier operating in a push-pull mode, but without requiring reactive components or an amplifying device, other than an output circuit device, which functions as a phase inverter.

Numerous applications exist for electronic circuits operating in a push-pull mode. Thus, for example, in such apparata as high fidelity sound reproduction systems, electronic amplifiers operating in a push-pull mode find frequent use. The present invention provides a basis for phase or polarity selective circuit operation, and accordingly a basis for the design of circuit configurations which utilize phase or polarity selective switching or gating circuitry to overcome problems of the prior art. These problems have included distortion due to amplification of the single-ended input signal during the transformation into two out-of-phase output signals, distortion due to asymmetrical loading of the input signal, and distortion due to the input signal being permitted to pass, at some point in the circuitry through a component of substantial inductance such as a speaker coil or a transformer.

Further problems of the prior art have been the compulsory utilization of feedback for linear circuit operation, low efficiency due to biasing or feedback circuitry, and regenerative feedback and hum resulting from the utilization of a common terminal shared by the input signal and load. In addition, it has been a practice of the prior art to pass the input signal through resistors which are generators of noise. As a result, this noise, and the noise generated by other resistors in the circuitry, substantially distorts and becomes a part of the signal which is applied to the output circuit active devices.

In transforming a single-ended input signal into two out-of-phase output signals, it is desirable to avoid substantial inductive and capacitive reactances in the passive circuit elements because such reactances adversely affect the frequency response of the circuit. Inductive or capacitive reactances are sometimes inherent properties of the active circuit elements or of the load, and so the fullest frequency range of a circuit including such active elements can only be achieved by avoiding substantial inductive or capacitive reactances in the passive circuit elements. In addition, if during the transformation of a single-ended input signal into two out-of-phase output signals, amplification of the input signal occurs before the signal is applied to the output circuit active devices, there is likely to be distortion of the signal.

Phase selective circuits operating in a push-pull mode, if designed for semiconductors, generally utilize output circuit active devices of dissimilar-conductivity-types. It is more difficult to find and substantially more expensive to manufacture semiconductor devices of dissimilar conductivity types having matched current transfer ratio or transconductance values than it is to obtain devices of like conductivity type having similar characteristics.

The basis for the phase or polarity selective operation of the electronic control or amplification circuitry of the present invention facilitates the utilization of switching or gating circuitry to perform the transformation of the single-ended input signal into two out-of-phase output signals. Any device to be utilized to perform the gating function must have at least two terminals and at least one conductive path which lies between these two terminals and facilitates the conduction of substantially more current in a first direction than is conducted in the opposite direction. Any device to be utilized to perform the switching function must have at least three terminals and at least two conductive paths. One conductive path, a control path, must lie between a source terminal and a control terminal. Another conductive path, a drain path, must lie between the source terminal and a drain terminal. The function of the drain path is dependent upon the electrical characteristics of the specific switching device being utilized. In addition, the two conductive paths may share a common source terminal.

The switching device must perform the function of controlling the flow of current along the drain path in response to a signal applied to its control path. The current transfer ratio or transconductance value of a switching device must be somewhat greater than the design minimum when resistors are utilized to limit the magnitude of the signal applied to the control path, if the circuitry is to prevent application of the noise generated by these components to the output devices. With this exception, the specifications of how and to what magnitude the control path should determine the flow of current in the drain path are dependent upon the particular application and other circuit considerations known to those in the art.

The output circuit active devices determine the current flow in the output circuitry in response to an input signal at their control terminals. As determined by the specific application, the output devices may amplify the input signal, or they may control current flow in the output circuit without amplification of the input signal. In addition, the phase selective circuitry may apply current to the load configuration without the utilization of additional output circuit active devices, when distortion of the input signal as a result of its application to the load configuration is not a substantial circuit consideration. In such applications, the utilization of a voltage source in the load configuration may not be compulsory.

The conductive paths of the output circuit active devices may be arranged in a series or in a parallel circuit configuration. Biasing circuitry may be utilized, but it is generally not essential for circuit operation. The present invention also facilitates the utilization of feedback circuitry, but it is generally not essential for linear circuit operation. The input signal may be permitted to apply a reverse potential across the control path of one or more output circuit active devices. The application of such a reverse phase of the input signal, with respect to the output circuit active device receiving the signal, increases the efficiency of a circuit configuration by placing the control paths of one or more output circuit active devices at a potential below cutoff. This basis or method for phase selective circuit operation also facilitates the utilization of switching or gating circuitry to prevent the application of a reverse phase of the input signal to the output circuit active devices. The characteristics of input signal application to the output circuit active devices are determined by the application and by the type of output circuit active devices utilized in the circuit configuration. In addition, the present invention facilitates the utilization of all methods of balancing applicable to output circuit configurations of the prior art. Furthermore, correction of the problems of static or dynamic unbalance generally requires less consideration for several reasons. First of all, the input signal is symmetrically loaded by the utilization of gating devices. Secondly, the single-ended input signal is not amplified during the transformation into two out-of-phase signals. Additionally, the output circuit active devices can be of the same conductivity type, facilitating the utilization of matched components.

Due to the similar characteristics of the output circuit active devices and due to isolation of the input signal from the load, this basis for phase-selective circuit operation facilitates the utilization of output circuit configurations which both cancel and eliminate sources of hum, for example from voltage sources which have an alternating current component in addition to the direct current component utilized to drive the load. As a further advantage, the present invention facilitates the design of circuit configurations which utilize fewer components and which therefore are less costly than circuits of the prior art that were designed for similar application.

In one aspect the present invention is a phase or polarity selective electronic control circuit. In this aspect, the invention is applicable to circuits which transform a single-ended input signal into two out-of-phase signals. This aspect of the invention thus finds use where broad frequency response and high efficiency are desired. The application of this basis for the phase or polarity selective operation of an electronic circuit facilitates the operation of switching or control circuitry at frequencies from zero hertz up to the upper limit of the particular active devices utilized within the circuit. The present invention facilitates the utilization of switching or gating means to transform the single-ended input signal into two out-of-phase output signals. Since there is substantially no amplification within the switching or gating circuitry and since all voltage sources within the output circuit configuration are isolated from the input signal, any maleficent potential at the input terminals is eliminated from the output, and so distortion is minimal. The circuitry can be assembled using any one of a variety of types of active devices, and the magnitude of the circuit components can be easily determined, thereby simplifying the design process.

In another aspect, the present invention is a phase or polarity selective amplification circuit capable of operation in a push-pull mode. The application of this basis for phase or polarity selective circuit operation facilitates the utilization of switching or gating means to apply the single-ended input signal to one or more active output elements in accordance with the phase or polarity of the input signal. Accordingly, the direction of current flow through the circuit load is determined by the phase of polarity of the input signal.

These and other aspects and advantages of the present invention are apparent in the following detailed description and claims, particularly when considered in conjunction with the accompanying drawings which represent the application of the present invention in practical circuit configurations that illustrate specific applications and that schematically demonstrate how the basis of phase-selective operation of the present invention applies to circuitry utilizing different classifications of output circuit configuration. There exist a vast number of circuit configurations based on the application of this invention of phase or polarity selective operation, and the considerations for each individual application determine the exact circuit configuration to be utilized, as is well known to those in the art.

IN THE DRAWINGS

Figure 1:
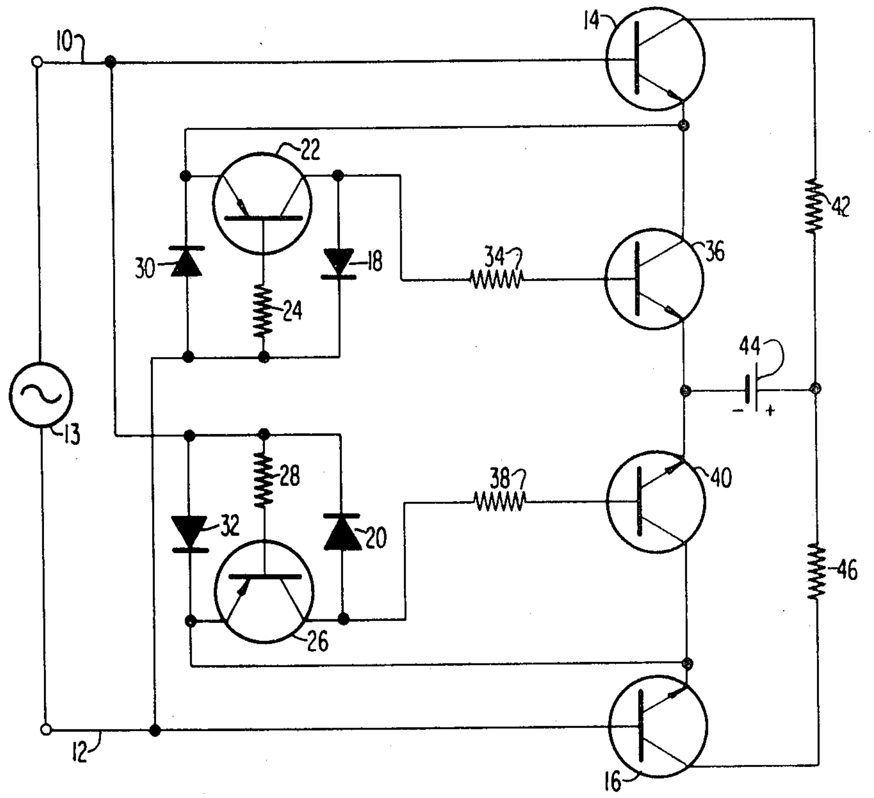
FIG. 1 is a schematic diagram representing a circuit in accordance with the first embodiment of the present invention.

The first embodiment of the present invention utilizes an output circuit configuration comprised of a tapped load or of two separate loads and permitting current to pass through each load section or each separate load individually from a direct current voltage source as a function of the phase or polarity of the input signal. This embodiment might include either of two basic output circuit configurations. The first output circuit configuration is comprised of those circuits in which the drain terminals of the output circuit active devices which receive the input signal are tied directly to load terminals, while the second configuration is comprised of those circuits where in the source terminals of the output circuit active devices which receive the input signal are tied directly to load terminals. In applications where an output circuit active device configuration of the first of these types is to be utilized, there are three primary considerations on which the switching or gating circuit configuration is based. The first consideration is the prevention of excessive shunting of the control paths of the output circuit active devices, and the present invention facilitates the utilization of gating devices to provide conductive paths between the input lines and the output circuit active devices while preventing the shunting of a substantial amount of the input signal past the control paths of the output circuit active devices. In addition, the utilization of these or other dating devices prevents asymmetrical shunting of the input lines.

The second consideration includes two things. The coupling path of the direct current voltage source to the source terminal of the output circuit active device which is energized during a first input signal phase must not include a greater resistance than does the coupling path of the direct current voltage source to the source terminal of the output circuit active device which is energized during the opposite phase of the input signal. In addition, the coupling of the input lines to the source terminal of the same output circuit active device which is to be energized during this opposite phase of the input signal must not include a greater resistance than does the coupling of the input lines to the source terminal of the same output circuit active device which is to be energized during an input signal of the first phase. The present invention avoids these circuit conditions by facilitating the utilization of switching devices in the output circuit configurations wherein the source terminals of the output circuit active devices are tied directly to the direct current voltage source.

A further consideration comprises the utilization of the input signal to control the potential applied to the control paths of the output circuit active devices. The present invention utilizes gating devices to prevent application of an undesired phase of the input signal to the control path of the output devices, since gating devices are available which do not pass a substantial amount of current in the reverse direction.

The voltage drop across a gating device in the phase-selective circuitry may result in the application of a portion of the input signal as a reverse potential across the control path of an output circuit active device unless the circuit configuration is designed to prevent this. However, the utilization of switching devices in the output circuit configuration allows more freedom in the design of the phase-selective switching or gating circuitry and facilitates the utilization of a greater portion of the input signal to apply a reverse potential across the control paths of the output circuit active devices, since the utilization of switching devices in the output circuit configuration facilitates isolation of the direct current voltage source from the individual output circuit active devices during the phase of the input signal which does not energize the particular output circuit active device.

The circuit in FIG. 1 represents an application of a first embodiment of the present invention in which both phases of the input signal are applied to those output circuit active devices which are directly energized by the input signal. The circuit operates with minimal distortion by avoiding the utilization of reactive passive circuit elements and by eliminating a maleficent shunting of the input signal around the control paths of the output circuit active devices by the circuitry which transforms the single-ended input signal into the two out-of-phase signals that energize the output circuit active devices. The circuit operates at maximum efficiency, since the direct current operating point of the output circuit active devices is at their cutoff potential, and since there is substantially no extraneous shunting of the input signal. With the possible exception of a small reverse leakage current along the control path of the output circuit active device which is energized by the opposite phase or polarity of the input signal, substantially all of the input signal is applied to the control path of that output circuit active device energized by the given phase or polarity, as determined by the phase-selective circuitry.

In the circuit depicted in FIG. 1, a single-ended input signal is applied across input lines 10 and 12, for example from source 13. Input line 10 is coupled through resistor 28 to the base of PNP-transistor 26 which has its emitter tied to the emitter of NPN-transistor 16. Input line 10 is also connected to the anode of diode 32 which has its cathode tied to the emitter of transistor 26 and thus to the emitter of transistor 16. In addition, input line 10 is connected to the cathode of diode 20 which has its anode tied to the collector of transistor 26.

NPN-transistor 40 has its base coupled through resistor 38 to the junction of the anode of diode 20 and the collector of transistor 26, its collector tied to the emitter of transistor 16 and thus to the cathode of diode 32 and to the emitter of transistor 26, and its emitter tied to the negative terminal of direct current voltage source 44. Transistor 16 has its collector coupled through load 46 to the positive terminal of direct current voltage source 44 and its base tied to input line 12.

Input line 12 is coupled through resistor 24 to the base of PNP-transistor 22 which has its emitter tied to the emitter of NPN-transistor 14. Input line 12 is also connected to the anode of diode 30 which has its cathode tied to the emitter of transistor 26 and thus to the emitter of transistor 14. In addition, input line 12 is connected to the cathode of diode 18 which has its anode tied to the collector of transistor 22. NPN-transistor 36 has its base coupled through resistor 34 to the junction of the anode of diode 18 and the collector of transistor 22, its collector tied to the emitter of transistor 14 and thus to the cathode of diode 30 and to the emitter of transistor 22, and its emitter tied to the negative terminal of direct current voltage source 44 and thus to the emitter of transistor 40. Transistor 14 has its collector coupled through load 42 to the junction of the positive terminal of direct current voltage source 44 and load 46, and its base tied to input line 10.

When the input signal applied across input lines 10 and 12 is of sufficient amplitude and of a first polarity or phase so that the potential on line 10 is more positive than that on line 12, then transistors 14 and 22 are turned on, while transistors 16 and 26 are cut off. Consequently, the emitter of transistor 14 is substantially at the same potential as is input line 12, and the emitter of transistor 16 is substantially at the same potential as input line 10, being separated therefrom only by forwardly biased diode 32.

Isolation of the output transistors 14 and 16 from the direct current voltage source 44 is accomplished by transistors 36 and 40. During this first phase of the input signal, transistor 22 is energized, and the input signal is coupled from input line 12 to the emitter of transistor 14 through the collector-emitter path or drain path of transistor 22 and the conductive path of diode 18.

Since transistors 14 and 22 are both conducting, a circuit from the positive terminal of direct current voltage source 44 through load 42 is completed to the base of transistor 36 through the drain paths of transistors 14 and 22 and through current limiting resistor 34. Accordingly, the base-emitter junction of transistor 36 receives a forward energizing bias from direct current voltage source 44, and transistor 36 is in a state of conduction. This completes a circuit comprised of direct current voltage source 44, the drain paths of transistors 14 and 36, and load 42 by means of which current flows in a first direction through load 42, and that first direction is a function of the input signal polarity.

Since transistor 26 is cut off, the base-emitter circuit of transistor 40 cannot be forward biased, and so transistor 40 is cut off. Because transistors 16 and 40 are cut off, no current flows through load 46.

When the input signal across input lines 10 and 12 is of the opposite polarity or phase so that the potential on line 12 is more positive than that on line 10, then transistors 14 and 22 are not in a state of conduction, and therefore transistor 36 no longer has a forward potential across its control path. Consequently, transistor 36 ceases to conduct. Transistor 14 is isolated from the direct current voltage source 44 by transistor 36. This prevents a maleficent shunting of the input terminals 10 and 12 and prevents the input signal from possibly being distorted, as might occur if it were permitted to pass through load 46. In addition, this isolation prevents a potential from direct current voltage source 44 from being applied across input terminals 10 and 12. A path of conduction is provided by diode 30 for the application of a reverse potential across the emitter-base junction of transistor 14.

When the input signal across lines 10 and 12 is of this opposite phase or polarity, transistor 16 and 26 are forward biased, and so they conduct. Potential from source 44 is applied through load 46 and the collector-emitter circuits of transistors 16 and 26 to forward bias transistor 40. Consequently, current is able to pass through load 44 via the drain paths of transistors 16 and 40. The operation of transistors 16, 26 and 40 on this opposite phase is identical to the operation of transistors 14, 22, and 36 during the first phase. Likewise, diodes 32 and 20 operate on this second phase in a manner identical to the operation of diodes 30 and 18 on the first phase of the input signal. Circuit operation is therefore symmetrical, passing current through load 42 in response to an input signal of a first phase or polarity, and passing current through load 46 in response to an input signal of the opposite phase or polarity.

Although the circuit in FIG. 1 utilizes transistors of the PNP-conductivity type in the phase selective circuitry and NPN-transistors as output circuit active devices, the two conductivity types can be interchanged with the appropriate potential changes known to those in the art.

In applications of the second output circuit active configuration, there are four primary considerations on which the switching or gating circuit configuration is based. A first consideration is preventing the possibility of distortion as a result of the input signal being permitted to pass through the load. The second consideration is preventing potential from the direct current voltage source from energizing an output circuit active device which receives the input signal across its control path. The third consideration is preventing a maleficent potential from being applied across the input lines by the direct current voltage source. The fourth consideration is utilization of the input signal at the control paths of the output circuit active devices.

The present invention facilitates the application of a reverse potential across the control paths of the output circuit active devices through the utilization of switching devices in the output circuit configuration which isolate the direct current voltage source from those output circuit active devices which receive the input signal and also facilitates the design of circuit configurations which utilize these switching devices to simultaneously satisfy the other primary circuit considerations.

A second embodiment of the present invention consists of a configuration permitting the phase or polarity selective operation of electronic control or amplification circuitry utilizing an output circuit comprised of a tapped direct current voltage source or two separate direct current voltage sources and a load or, as known to those in the art, one direct current voltage source and a load which is capacitively reactive. The output circuit is arranged so that current from a first direct current voltage source or voltage source section will pass through the load in a first direction and current from the second direct current voltage source or voltage source section will pass through the load in an opposite direction as a function of the phase or polarity of the input signal.

There are four primary considerations on which the switching or gating circuit configurations of this embodiment are based. The first consideration is comprised of preventing an output circuit active device which is to be energized by the application of an input signal of a given phase or polarity from being energized by the direct current voltage source either directly or through a circuit completed by the drain path of an output circuit active device which is energized by the application of an input signal of the opposite phase or polarity. A second consideration comprises preventing the possibility of distortion as a result of the input signal being permitted to pass through the load. A third consideration comprises preventing a direct current voltage source from placing a maleficent potential across the input lines. These considerations are satisfied by the utilization of three basic types of phase-selective switching or gating circuitry which isolate the load and voltage sources from the input lines and from the control terminals of the output circuit active devices. These three types comprise the utilization of switching and gating circuitry which does not lie within the output circuit configuration, the utilization of a gating device within the output circuit which couples the load and an input line which would otherwise be more directly connected to the load, and the utilization of one or more switching devices in the output circuit to perform the isolation functions.

A further consideration comprises preventing or permitting a utilization of the input signal to apply a reverse potential to the control paths of the output circuit active devices. This basis for the phase or polarity selective operation of electronic circuitry facilitates the utilization of switching or gating devices to control the application of the input signal in the manner desired.

Figure 2:
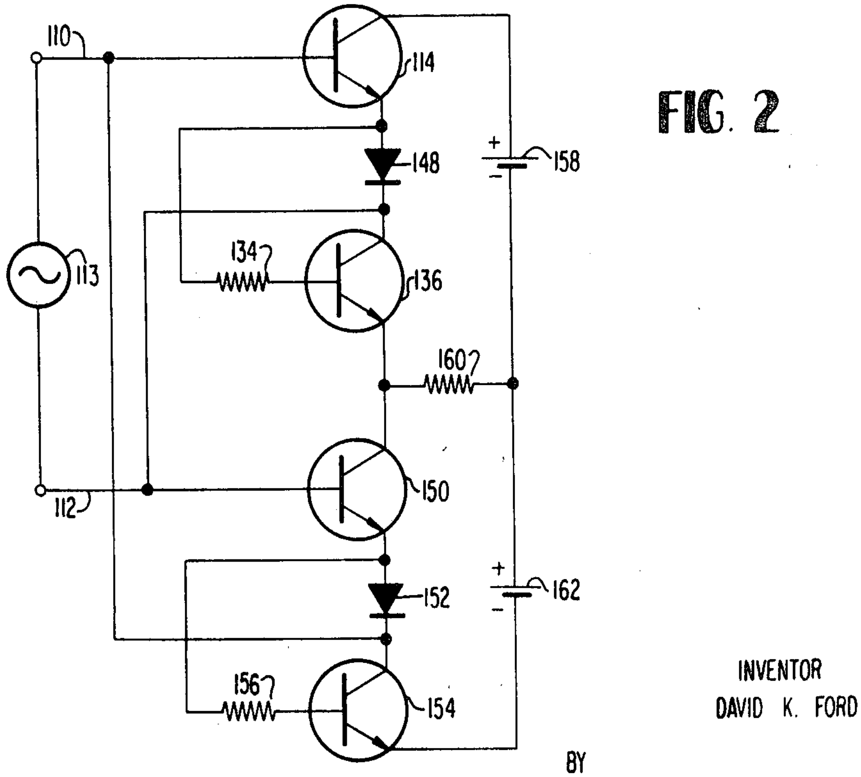
FIG. 2 is a schematic diagram representing a circuit in accordance with a second embodiment of the present invention.

The circuit depicted in FIG. 2 represents an application of the second embodiment of the present invention in which the phase selective circuitry is designed to prevent a reverse potential from being applied to the output circuit active devices by the input signal. The circuit operates with minimal distortion by avoiding the utilization of reactive passive circuit elements, and by eliminating a maleficent shunting of the input signal around the control paths of the output circuit active devices by the circuitry which transforms the single-ended input signal into the two out-of-phase signals which energize the output circuit active devices.

The resistors utilized to limit control path current in the output circuit switching devices do not add noise to the input signal, nor is the signal distorted by being permitted to pass through the load. The direct current voltage sources are isolated from the input lines and from the control paths of the output circuit active devices, thus eliminating a maleficent potential across the input lines and eliminating a potential source of circuit unbalance. In addition, each phase of the input signal passes current through only two components, thus facilitating the preservation of a low distortion level should the components' characteristics vary with age.

As depicted in FIG. 2, a single-ended input signal is applied across input lines 110 and 112, for example by source 113. Input line 110 is connected to the collector of NPN-transistor 154 and to the cathode of diode 152. Transistor 154 has its emitter tied to the negative terminal of direct current voltage source 162 and its base coupled through resistor 156 to the anode of diode 152 and the emitter of NPN-transistor 150. Transistor 150 has its collector connected to one side of load 160, the second side of which is tied to the positive terminal of voltage source 162. The base of transistor 150 is tied to input line 112.

Input line 112 is also connected to the collector of NPN-transistor 136 and to the cathode of diode 148. Transistor 136 has its emitter tied to the collector of transistor 150, and thus to the first terminal of load 160, and its base coupled through resistor 134 to the anode of diode 148 and the emitter of NPN-transistor 114. Transistor 114 has its collector tied to the positive terminal of direct current voltage source 158 and its base tied to input line 110. The negative terminal of voltage source 158 is connected to the positive terminal of voltage source 162 and thus to the second terminal of load 160

When the input signal applied across input lines 110 and 112 is of a first phase or polarity so that the potential on line 110 is more positive than that on line 112, transistor 114 is turned on. During this first phase when transistor 114 is in a state of conduction, potential from source 158 is applied through the drain path of transistor 114, current limiting resistor 134, and load 160 to forward bias transistor 136. Accordingly, transistor 136 is turned on. This completes a circuit from direct current voltage source 158, through the drain path of transistor 114, diode 148, the drain path of transistor 136, and load 160, through which current flows in a first direction as a function of this input signal. With this first phase or polarity of input signal, with line 110 positive with respect to line 112, transistor 150 is cut off, and diode 152 blocks the input from transistor 154. Consequently, the voltage source 162 and load 160 are isolated from input line 110, and in addition no current can flow from source 162 through load 160.

When the input signal across input lines 110 and 112 is of the opposite phase or polarity, transistor 114 is cut off, and diode 148 prevents the input potential from being applied to transistor 116 which therefore cuts off. Consequently, load 160, voltage source 168 and voltage source 162 are isolated from input line 112.

This opposite phase or polarity of the input signal turns on transistor 150, and a circuit from the positive terminal of direct current voltage source 162 to the base of transistor 154 is completed through load 160, the drain path of transistor 150, and current-limiting resistor 156. Since transistor 154 has its emitter tied to the negative terminal of direct current voltage source 162, the base-emitter junction of transistor 154 receives a forward-energizing potential, and transistor 154 is in a state of conduction. This completes a circuit from direct current voltage source 162, through the drain path of transistor 150, diode 152, the drain path of transistor 150 and load 160 through which current flows in the direction opposite that previously described. Thus, the direction of current flow through load 160 is a function of the input signal phase or polarity.

Although the circuit depicted in FIG. 2 utilizes transistors of the NPN-conductivity type as the output circuit active devices and although only one of the three basic methods of isolation is depicted, this phase or polarity selective circuit facilitates the design of circuits for similar application in which the semiconductor-conductivity type are interchanged, with the appropriate potential changes, as known to those in the art.

A further embodiment of the present invention consists of a phase or polarity selective electronic control or amplification circuit utilizing an output circuit configuration which consists of a load and a direct current voltage source. The output circuit active devices complete circuits which include the load and direct current voltage source. The output circuit active devices also determine the direction or additionally the magnitude of current flow in the load as a function of the input signal.

There are six primary considerations on which the switching or gating circuit configurations are based. The first consideration is preventing an output circuit active device which is to be energized by the application of an input signal of a given phase or polarity from being energized by the direct current voltage source either directly or through a circuit completed by the drain path of an output circuit active device energized by the application of an input signal of the opposite phase or polarity. A second consideration is preventing the input signal from being excessively or asymmetrically loaded. A third consideration is preventing the direct current voltage source from placing a maleficent potential across the input lines. A fourth consideration is preventing the control paths of the output circuit active devices from being excessively shunted. A fifth consideration is preventing the possibility of distortion as a result of the input signal being permitted to pass through the load. A further consideration is the utilization of the input signal to apply a reverse potential to the control paths of the output circuit active devices. The methods utilized to satisfy these considerations are similar to the methods of satisfying similar considerations described in conjunction with the first and second embodiments.

Figure 3:
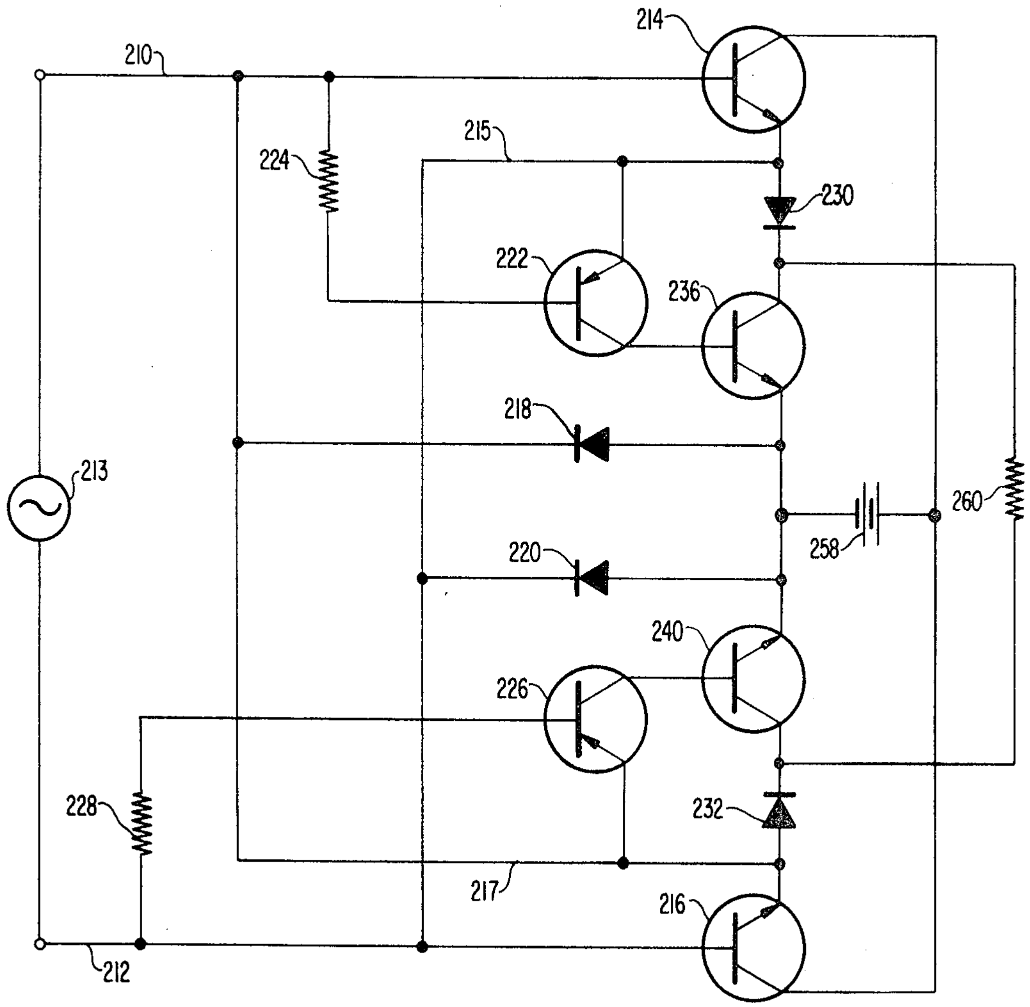
FIG. 3 is a schematic diagram representing a circuit in accordance with a further embodiment of the present invention.

The circuit depicted in FIG. 3 represents an application of this further embodiment of the present invention in which the phase-selective circuitry is designed to permit the utilization of the input signal to apply a reverse potential to the control paths of the output circuit active devices. All of the circuit considerations for this embodiment are satisfied, and the circuit operates with minimal distortion since the input lines are tied directly to the control path terminals of the output circuit active devices. In addition, the resistors utilized to limit control path current in the output circuit switching devices are placed in the circuit so as not to add noise to the input signal.

In the circuit depicted in FIG. 3, a single-ended input function is applied across input lines 210 and 212, for example, from source 213. Input line 210 is connected to the base of NPN-transistor 214 which has its emitter tied by line 215 to input line 212. PNP-transistor 222 has its base coupled by resistor 224 to input line 210, its emitter tied to line 215, and its collector tied to the base of NPN-transistor 236. The emitter of transistor 214 is tied to the anode of diode 230, the cathode of which is connected to the collector of transistor 236. The emitter of transistor 236 is connected to the anode of diode 218 which has its cathode tied to input line 210.

Input line 212 is connected to the base of NPN-transistor 216 which has its emitter tied by line 217 to input line 210. PNP-transistor 226 has its base coupled through resistor 228 to input line 212, its emitter tied to line 217 and its collector tied to the base of NPN-transistor 240. The emitter of transistor 216 is connected to the anode of diode 232, the cathode of which is connected to the collector of transistor 240. The emitter of transistor 240 is tied to the anode of diode 220 which has its cathode connected to input line 212.

The collector of transistor 214 is connected to the positive terminal of DC voltage source 258. Likewise, the collector of transistor 216 is connected to the positive terminal of voltage source 258. The negative terminal of voltage source 258 is connected to the emitter of transistor 236 and to the emitter of transistor 240. Load 260 is coupled between the collector of transistor 236 and the collector of transistor 240.

When the input signal applied across lines 210 and 212 is of a first polarity or phase so that the potential on line 210 is more positive than that on line 212, transistor 214 is forward biased and so conducts. Transistor 222 is back biased and so is cut off. Transistor 236 has its emitter coupled through diode 218 to the more positive input line 210 and its base tied to the collector of cutoff transistor 222. Consequently, transistor 236 is cut off. In like manner, transistor 216 is back biased and so is cut off, transistor 226 is forward biased and so conducts. The base of transistor 240 is coupled by the emitter-collector path or drain path of transistor 226 to input line 210, while the emitter of transistor 240 is coupled by diode 220 to input line 212. Consequently, transistor 240 conducts. A current path thus exists from the positive terminal of DC voltage source 258 through the collector-emitter circuit or drain circuit of transistor 214, diode 230, load 260, and the collector-emitter path or drain path of transistor 240 to the negative terminal of voltage source 258. Consequently, current flows from voltage source 258 through load 260 in a first direction.

When the input signal applied across lines 210 and 212 is of the opposite polarity or phase so that line 212 is more positive than line 210, transistors 216, 222 and 136 conduct, while transistors 214, 226 and 240 are cut off. A current path then exists from the positive terminal of voltage source 258 through the collector-emitter circuit or drain circuit of transistor 216, diode 232, load 260, and the collector-emitter circuit or drain circuit of transistor 236 to the negative terminal of the voltage source 258. Current thus flows form voltage source 258 through load 260 in the second direction. The direction of current flow through load 260 is, therefore, dependent upon the polarity or phase of the input signal applied across input lines 210 and 212.

While the embodiment of FIG. 1 utilizes a single voltage source for dual loads, no push-pull action is provided. The embodiment of FIG. 2 utilizes two voltage sources to provide push-pull operation with a single load. In the embodiment of FIG. 3, push-pull operation of a single load is achieved with a single voltage source, while not requiring a transformer or other inductive element.

FIGS. 1, 2, and 3 depict circuits which are applications of three embodiments of the present invention, which use various output circuit configurations, and which utilize transistors as the active devices. Numerous other active elements might be used in place of these transistors. For example, field effect devices, unijunction devices, thyristors, magnetic amplifiers, vacuum tubes, or relays could be utilized, and the particular active component selected is primarily determined by considerations such as cost and the upper frequency limit. Additionally, for a particular application, the circuitry of the present invention may be utilized in multiphase applications utilizing three or more input lines.

This basis for phase or polarity selective circuit operation facilitates the utilization of inductive or capacitive loads and it facilitates circuit operation at the minimum level of distortion and maximum frequency bandwidth determined by these elements. The circuits depicted in the figures are designed for Class-B operation The present invention facilitates the design of circuitry for any class of operation. Class-C operation, for example, may be obtained through the utilization of zener devices.

What is claimed is:

1. An electronic circuit comprising:
first and second input terminals;
output means;
first and second output circuits each including:
a. a first solid-state switching device having a control element connected to an uniquely associated one of the input terminals, a source element connected to a first terminal of the output means, and a drain element;
b. a second solid-state switching device having a control element, a source element coupled to the drain element of the first solid-state switching device of the same output circuit, and a drain element connected to a second terminal of the output means;
c. first coupling means coupling the first solid-state switching device drain element to the other of the input terminals to activate the first output circuit first solid-state switching device in response to an input signal of a first phase uniquely associated with the first output circuit and to activate the second output circuit first solid-state switching device in response to an input signal of a second phase opposite the first phase;
d. second coupling means coupling the second solid-state switching device control element to the first solid-state switching device drain element of the same output circuit while isolating the second solid-state switching device control element from the input terminals to activate the second solid-state switching device in response to output means current through the first solid-state switching device.

2. A circuit as claimed in claim 1 in which said output means is connected to load means to cause current to flow therethrough in a first direction when said first output circuit is activated in response to an input signal of a first phase at the first and second input terminals and to cause current to flow therethrough in a second direction when said second output circuit is activated in response to an input signal of a second phase, opposite the first phase, at the first and second input terminals.

3. A circuit as claimed in claim 1 in which said output means is connected to first load means to cause current to flow therethrough when said first output circuit is activated in response to an input signal of a first phase at the first and second input terminals and in which said output means is connected to second load means to cause current to flow therethrough when said second output circuit is activated in response to an input signal of a second phase, opposite the first phase, at the first and second input terminals.

4. A circuit as claimed in claim 1 in which the first and second solid-state switching devices of each output circuit include transistors.

5. A circuit as claimed in claim 1 in which the second coupling means comprises a first diode having its anode tied to said first solid-state switching device drain terminal and to said second solid-state switching device control terminal and having its cathode tied to said second solid-state switching device source terminal and to said other of the input terminals.

6. A circuit as claimed in claim 1 in which within each output circuit the second coupling means comprises a transistor having its drain circuit coupling said first solid-state switching device drain element with said second solid-state switching device control element and having its control electrode connected to said other of the input means.

7. A circuit as claimed in claim 5 in which each said transistor is of like-conductivity type.

8. A circuit as claimed in claim 1 in which within each output circuit the second coupling means comprises a transistor having its drain circuit coupling said second solid-state switching device control element with said first solid-state switching device drain element and having its control electrode connected to said one of the input means.

* * * * *